(12) United States Patent
Adam

(10) Patent No.: US 7,836,423 B2
(45) Date of Patent: Nov. 16, 2010

(54) SUM OF COHERENT SYSTEMS (SOCS) APPROXIMATION BASED ON OBJECT INFORMATION

(75) Inventor: Konstantinos Adam, Belmont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 471 days.

(21) Appl. No.: 11/715,667

(22) Filed: Mar. 8, 2007

(65) Prior Publication Data

US 2007/0218176 A1   Sep. 20, 2007

Related U.S. Application Data

(60) Provisional application No. 60/780,191, filed on Mar. 8, 2006.

(51) Int. Cl.
*G06F 17/50* (2006.01)
(52) U.S. Cl. .............................. 716/21; 716/2
(58) Field of Classification Search .............. 716/2, 716/18–21
See application file for complete search history.

(56) References Cited

U.S. PATENT DOCUMENTS

| 5,447,810 | A | 9/1995 | Chen et al. | |
|---|---|---|---|---|
| 6,738,859 | B2 | 5/2004 | Liebchen | |
| 7,079,223 | B2 * | 7/2006 | Rosenbluth et al. | 355/67 |
| 7,266,480 | B2 | 9/2007 | Adam | |
| 7,266,803 | B2 * | 9/2007 | Chou et al. | 716/21 |
| 7,331,033 | B2 * | 2/2008 | Feldman | 716/21 |
| 7,378,202 | B2 * | 5/2008 | Granik et al. | 430/30 |
| 7,467,072 | B2 | 12/2008 | Adam | |
| 7,512,927 | B2 * | 3/2009 | Gallatin et al. | 716/19 |
| 2003/0064298 | A1 | 4/2003 | Broeke et al. | |
| 2005/0015233 | A1 | 1/2005 | Gordon | |
| 2007/0253637 | A1 | 11/2007 | Adam | |

OTHER PUBLICATIONS

Adam, "Domain Decomposition Methods for the Electromagnetic Simulation of Scattering from Three-Dimensional Structures with Applications in Lithography," Ph.D. Dissertation, University of California, Berkeley, 195 pp. (Fall 2001).

(Continued)

*Primary Examiner*—Jack Chiang
*Assistant Examiner*—Binh C Tat
(74) *Attorney, Agent, or Firm*—Klarquist Sparkman, LLP

(57) ABSTRACT

A method for determining kernels in a sum of coherent systems (SOCS) approximation is provided. Information for an object to be simulated in a manufacturing process is determined. For example, information based on geometries that are included in a layout or mask is determined. A set of kernels from a transmission cross coefficient (TCC) matrix are also determined. The set of kernels may be weighted by importance values in an order of importance. The kernels may then be re-ordered based on the information for the object. These kernels are then re-ordered in the SOCS series to reflect their order of importance. The SOCS series of kernels is then truncated at the number of kernels desired. Accordingly, by re-ordering the kernels that may be more relevant to the object to include higher weights, when the truncation occurs, the kernels that are most relevant may be included in the SOCS approximation.

23 Claims, 7 Drawing Sheets

OTHER PUBLICATIONS

Adam et al., "Efficient phase defect modeling using domain decomposition methods," J. Vac. Sci. Technol. B, vol. 20, No. 6, pp. 3035-3039 (Dec. 2002).

Adam et al., "Methodology for Accurate and Rapid Simulation of Large Arbitrary 2D Layouts of Advanced Photomasks," *21st Annual Bacus Symp. On Photomask Technology*, 18 pp. (Oct. 2001).

Adam et al., "Simplified Models for Edge Transitions in Rigorous Mask Modeling," *Int'l Symp. On Microlithography*, 14 pp. (Mar. 2001).

Cobb et al., "Fast Sparse Aerial Image Calculation for OPC," *Proc. SPIE*, vol. 178, pp. 805-816 (2004) [reprint of Cobb et al., "Fast Sparse Aerial Image Calculation for OPC," Proc. SPIE, vol. 2621, pp. 534-545 (Dec. 1995)].

\* cited by examiner

SUM OF COHERENT SYSTEMS (SOCS) APPROXIMATION BASED ON OBJECT INFORMATION

CROSS REFERENCES TO RELATED APPLICATIONS

This application claims priority from U.S. Provisional Patent Application Ser. No. 60/780,191 entitled HYBRID HOPKINS-ABBE SOCS METHOD WITH GEOMETRY-AWARE SOCS TRUNCATION, filed on Mar. 8, 2006, which is hereby incorporated by reference as if set forth in full in this application for all purposes.

BACKGROUND

Particular embodiments generally relate to photolithographic processing and more specifically to a sum of coherent systems (SOCS) approximation optimization.

Lithographic and other processes often have certain signature distortions that fabricate less than optimal features in integrated microdevices. If these distortions can be modeled, the device layout or design can be compensated in anticipation of these fabrication problems. OPC (Optical and Process Correction, or sometimes Optical Proximity Correction) involves making systematic modifications to photomask geometries to increase the achievable resolution and pattern transfer fidelity for photolithography in IC manufacturing. This is accomplished by compensating mask geometry for predictable effects that will occur during imaging or subsequent processing.

A simulation engine is used to provide an accurate simulation of the on-wafer shape, given an input shape on the mask. Conventional simulation engines use the Sum of Coherent Systems (SOCS) approximation, in which on-wafer light intensity for partially coherent illumination is decomposed into an incoherent sum of intensities from a nominally infinite number of coherent systems. The sum of coherent systems (SOCS) approximation may be used to approximate a Hopkins imaging integral. For example, a transmission cross coefficient (TCC) matrix may be decomposed via Eigenvalue decomposition (EVD) into a finite set of kernels (SOCS kernels) whose order of importance in the SOCS series coincides with the magnitude of the respective Eigenvalue. The number of kernels in a SOCS series is large and thus, the SOCS approximation uses only a finite number of kernels, N. The number N is determined to balance accuracy and time taken to compute the sum. For example, the series may be cut off after the first ten or twenty kernels.

The transmission cross coefficients (TCCs) are generated based on the illumination source and projection system being used. Thus, no matter what mask is being used to determine the image intensity, the same finite set of kernels is used. This may be produce results that are not as accurate and/or may not be the most computationally efficient for a particular photomask layout.

SUMMARY

In one embodiment, a method for determining kernels in a sum of coherent systems approximation is provided. Information for an object to be simulated in a manufacturing process is determined. For example, information based on geometries that are included in a layout or photomask is determined. A set of kernels from a transmission cross coefficient (TCC) matrix are also determined. The set of kernels may be weighted by importance values in an order of importance in a SOCS series. The kernels may then be re-ordered based on the information for the object. For example, the geometry information for the object is used to determine which kernels may be more relevant for the object. These kernels are then re-ordered in the SOCS series to reflect their order of importance. The SOCS series of kernels is then truncated at the number of kernels desired. Accordingly, by re-ordering the kernels that may be more relevant to the object to have higher weights, when the truncation occurs, the kernels that are most relevant may be included in the SOCS approximation. Thus, more accurate image intensities may be determined when using the SOCS approximation in a Hopkins approach.

In one embodiment, a method for determining kernels in a sum of coherent systems (SOCS) approximation is provided. The method comprises: determining information for an object to be simulated for a manufacturing process; determining a set of kernels that represent a transmission cross coefficient (TCC) matrix, wherein the kernels in the set are associated with importance values; analyzing the set of kernels and information for the object to determine if one or more of the kernels in the set of kernels should have a different importance value; and assigning a different importance value for one or more kernels in the set of kernels based on the analysis.

In another embodiment, a computer readable medium comprising one or more instructions for execution by the one or more processors is provided. The one or more instructions are configured to determine kernels in a sum of coherent systems (SOCS) approximation and when executed by the one or more processors operable to: determine information for an object to be simulated for a manufacturing process; determine a set of kernels that represent a transmission cross coefficient (TCC) matrix, wherein the kernels in the set are associated with importance values; analyze the set of kernels and information for the object to determine if one or more of the kernels in the set of kernels should have a different importance value; and assign a different importance value for one or more kernels in the set of kernels based on the analysis.

In yet another embodiment, a system configured to determine kernels in a sum of coherent systems (SOCS) approximation is provided. The system comprises: an object information determiner configured to determine information for an object to be simulated for a manufacturing process; a SOCS series determiner configured to determine a set of kernels that represent a transmission cross coefficient (TCC) matrix, wherein the kernels in the set are associated with importance values; a kernel analyzer configured to analyze the set of kernels and information for the object to determine if one or more of the kernels in the set of kernels should have a different importance value; a kernel reorder configured to assign a different importance value for one or more kernels in the set of kernels based on the analysis; and a model determiner configured to generate a model for an image intensity to be used in simulating optical effects of the object in the manufacturing process.

A further understanding of the nature and the advantages of particular embodiments disclosed herein may be realized by reference of the remaining portions of the specification and the attached drawings.

DETAILED DESCRIPTION OF EMBODIMENTS

To produce modern microdevices such as integrated circuits with photolithographic techniques, most photolithographic reticles or photomasks employ some sort of resolution enhancement technology (RET). Examples of RETs include optical and process correction (OPC, sometimes also called optical proximity correction) that may be used to determine distortions that may occur in a lithographic processing to improve the ability of the system to print a desired pattern of objects on a semiconductor wafer. Although photolithography is described, it will be understood that particular embodiments may be used in other processes, such as phase-shifting masks (PSM), chemical mechanical processing (CMP), etch, etc.

To apply these RETs, the effect of these distortions on the actual geometric structures of a microdevice is simulated. The impact of the distortions may be determined and features in a layout may be changed to account for the distortions that may occur.

Particular embodiments simulate the image intensity at a plane for a given photomask layout pattern using a particular illumination source. The image intensity may be used to perform OPC or RET techniques. A SOCS approximation may be used in the computation of the image intensity. Particular embodiments reorder a series of kernels derived from a transmission cross coefficient (TCC) function based on object information. The object information may be geometric information for an object, such as a photomask, being used in a simulation process.

Figure 1:
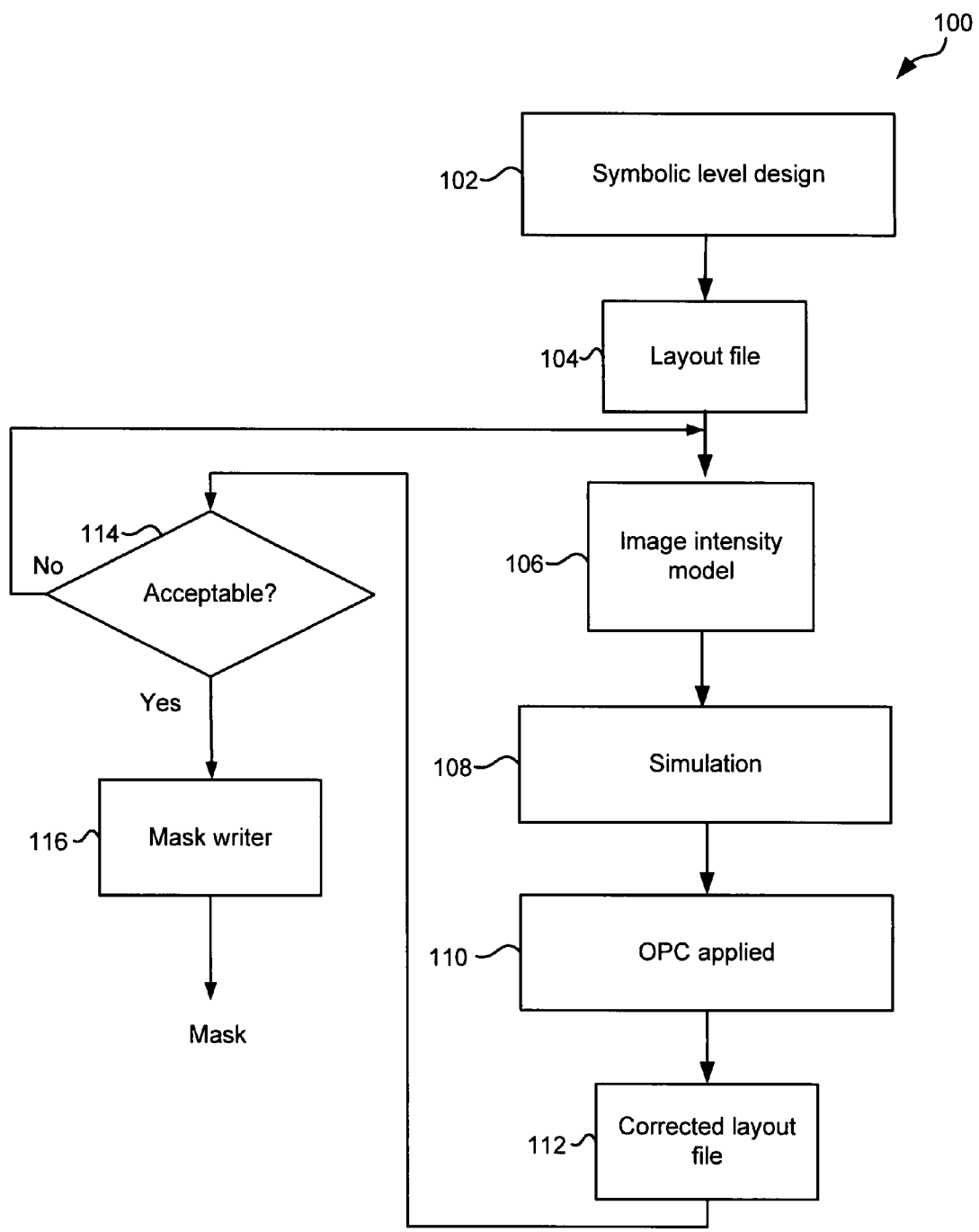
FIG. 1 depicts a design verification and RET process according to one embodiment.

FIG. 1 depicts a design verification and RET process according to one embodiment. The process includes determining a symbolic level design 102. Symbolic level design 102 may be a register transfer logic (RTL) representation of an IC design. A data layout file 104 or portion thereof, is determined that defines a desired pattern of objects to be created on a wafer. This is typically a layer of a device layout in a standard format such as graphical design system (GDS)-II or OASIS, although other formats can also be used. The data in these layers will be used to define the shape of the openings in the photolithographic reticle or mask that will be used in a photolithography system.

A simulation 108 at any given point in the image plane of an image intensity of the projected light from a photomask fabricated using data in layout file 104 is carried out using an image intensity model 106. From the results of the simulated image intensity, OPC or other RETs 110 are applied to the layout data to compensate for the predicted distortions and improve the resolution and pattern fidelity of the printed objects. A corrected layout file 112, including the results of the applied RETs, may be determined. It is then determined if corrected layout file 112 is acceptable for use in generating a mask. For example, a user or application may determine if corrected layout file 112 is acceptable or not. If not, the process may reiterate to perform the simulation again with data in corrected layout file 112.

If corrected layout file 112 is acceptable, it is provided to a mask writer 116 that produces a number of masks or reticles (hereinafter commonly referred to as a mask) used in the lithographic system to produce the desired devices on wafers.

Figure 2:
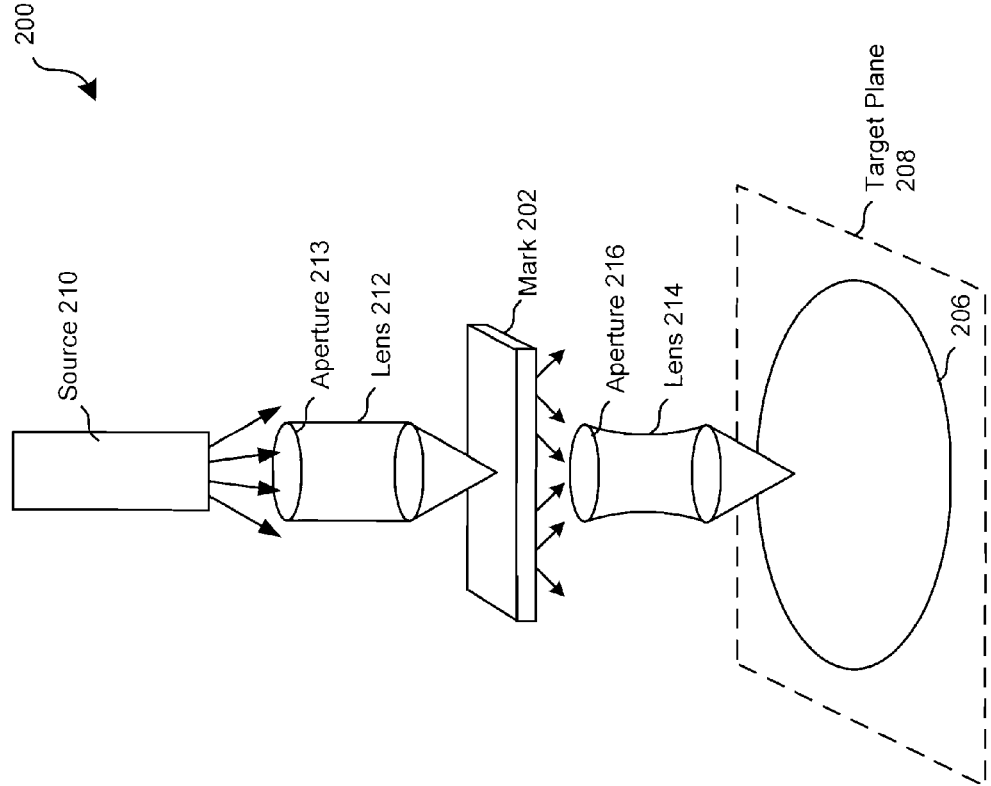
FIG. 2 is a schematic side view of a system for projection of a mask onto a target plane according to one embodiment.

FIG. 2 is a schematic side view of a system 200 for projection of a mask 202 onto a target plane 208 according to one embodiment. Typically, mask 202 embodies a predetermined design for a thin film layer that is to be formed by photolithography on a substrate 206 at plane 208, as is known in the art.

An illumination source 210 emits radiation, which typically comprises visible, ultraviolet or infrared radiation. In one embodiment, source 210 may be an examer laser. A condenser lens 212, having an aperture 213, focuses the light from source 210 through mask 202. Mask 202 may be a structure that includes a pattern for a circuit layout of an integrated circuit. The pattern is illuminated which causes diffraction in the light. The light then shines through a projection lens 214 having an aperture 216, which focuses an aerial image of mask 202 onto plane 208. Typically, lenses 212 and 214 comprise complex, multi-element lenses. The respective apertures 213 and 216 and respective distances of lenses 212 and 214 from mask 202 define respective numerical apertures.

Figure 3:
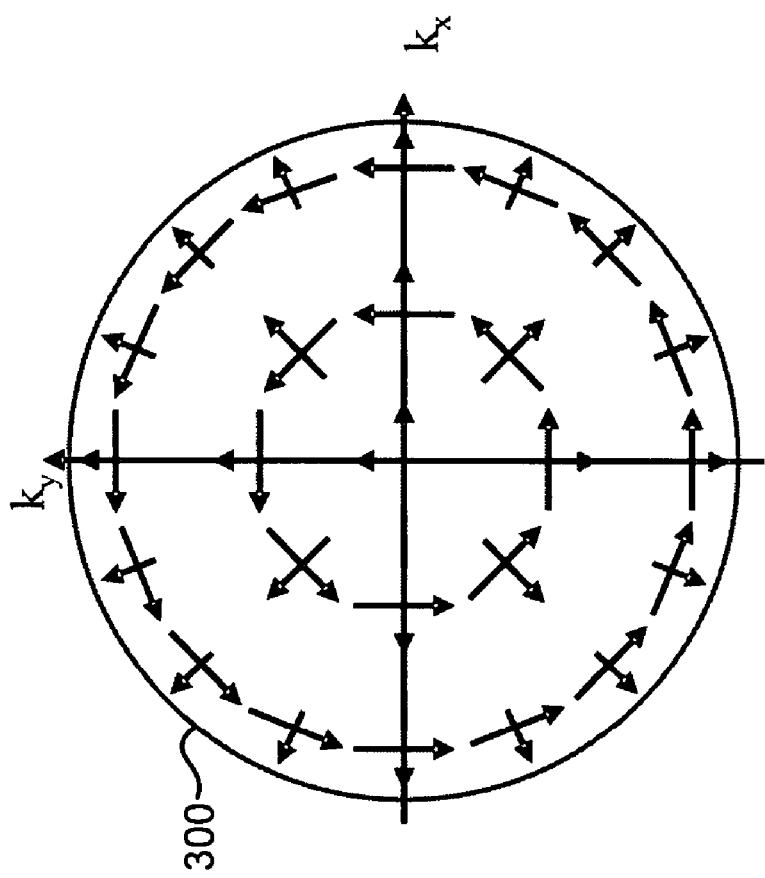
FIG. 3 depicts a source map of plane waves that is used to determine image intensity according to one embodiment.

The optical effects of objects printed onto substrate 206 in system 200 may be simulated. FIG. 3 depicts an illumination source map 300 comprising plane waves of variable polarization (represented by arrows in source map 300) that is used in the determination of the image intensity according to one embodiment. The source map may be a k-space diagram of plane waves. Source map 300 may be used to determine an image intensity for an image of mask 202 using the Hopkins approach.

The Hopkins approach is known in the art and is used to determine an image intensity leveling at the image plane. That is, the image intensity of light that results after being focused by lens 214. A Hopkins approach may be used to determine the image intensity using source map 300.

The Hopkins approach may be calculated using an integral to determine the image intensity for use in an image intensity model 106. The Hopkins imaging integral is represented by equation (1).

$$i(x, y) = \int\int\int_{-\infty}^{\infty}\int \left[ \int\int_{-\infty}^{\infty} \frac{J_0(f, g)\overline{K}(f+f', g+g')}{\overline{K}^*(f+f'', g+g'')df dg} \right] \qquad (1)$$

$$\cdot \overline{T}_0(f', g')\overline{T}_o^*(f'', g'')e^{-j2\pi[(f'-f'')x+(g'-g'')y]}df'dg'df''dg''$$

The TCCs in the Hopkins imaging integral may be approximated by a mathematical series representing a finite sum of coherent systems (SOCS). It should be noted that although the Hopkins approach is described as being used in the above process, particular embodiments may be applied for any method for which the SOCS approximation is valid. A series of kernels for the sum of coherent systems (SOCS) can be determined that represents the TCC function. A transmission cross coefficient (TCC) matrix for the function may be decomposed via Eigenvalue decomposition (EVD) into a finite set of kernels whose order of importance in the SOCS kernel series coincides with the magnitude of their respective Eigenvalue. The series is truncated to a smaller discrete number of terms as a fraction of the complete series. The discrete number of terms is then convolved with a mask transmission function to determine the image intensity. The mask transmission function is derived from parameters related to the geometries in a layout that are used to print the mask. In one embodiment, equation (2) may be used to determine the image intensity:

$$i(x, y) \cong \sum_{k=1}^{N} \sigma_k |h_k(x, y) \otimes T_o(x, y)|^2 \qquad (2)$$

Conventionally, the number of kernels in the SOCS series is truncated. The SOCS series is only based on the TCC function, which is derived from parameters of the optical system used. This does not take into account the layout of the photomask being used. Thus, no matter which object is being simulated in an OPC process, the TCC function will be the same. When the kernels are selected, the series is cut off at a certain number of kernels that have the highest weights, such as the top 10, based for example on the eigenvalue magnitude. These kernels, however, may not be the most relevant to the object being simulated. Accordingly, particular embodiments use information about an object that is being simulated to determine which kernels should be included in the finite set of kernels to determine the image intensity. The object may be information for mask 202, information about the layout, or other information for the object. It should be understood that the term object, mask, and layout may be used interchangeably. In one embodiment, the information may be about the geometries of the object. For example, geometric information may be information for the object is in the layout or in mask 202.

The kernels that may be selected may provide better simulation accuracy. Also, the speed of simulation may be improved for this degree of accuracy, because the most relevant kernels are included in the SOCS series.

In one embodiment, a process may use the kernels and object information to rank the kernels. A partial sum may be computed for different locations in source map 300. For example, if equation (2) is applied at a single point, the equation may simplify to an integral of a kernel and the mask transmission function at the point. The kernel includes a weight and can be multiplied by a value of the mask transmission function at the point. This may yield a partial value for the sum. This process may be repeated for different points, where different kernels may be used for different points. Also, the mask transmission function may have different values at the different points. This yields different partials values, which may be evaluated to determine which kernels yielded results such that they may be considered more relevant to the object. For example, if a kernel with a weight that ranks it seventh in the series based on eigenvalue magnitude yields a lower partial value than a kernel ranked with a lower eigenvalue weight, then the kernel ranked with a lower weight may be moved up in the series and be associated with a higher rank and the kernel ranked seventh may be moved down in the series and be associated with a lower rank. It will be understood that other ways of determining the importance of kernels and re-ordering the kernels will be appreciated. However, in any method used, the information for the object is used to determine the re-ordering.

Thus, by using information from the object to be simulated, the computational accuracy of the SOCS approximation may be significantly improved because kernels that are more relevant to the object may be selected for use in the approximation. Also, if fewer kernels are used, the approximation may be more accurate but can also be performed faster. Accordingly, a geometry-aware SOCS solution is provided.

Figure 4:
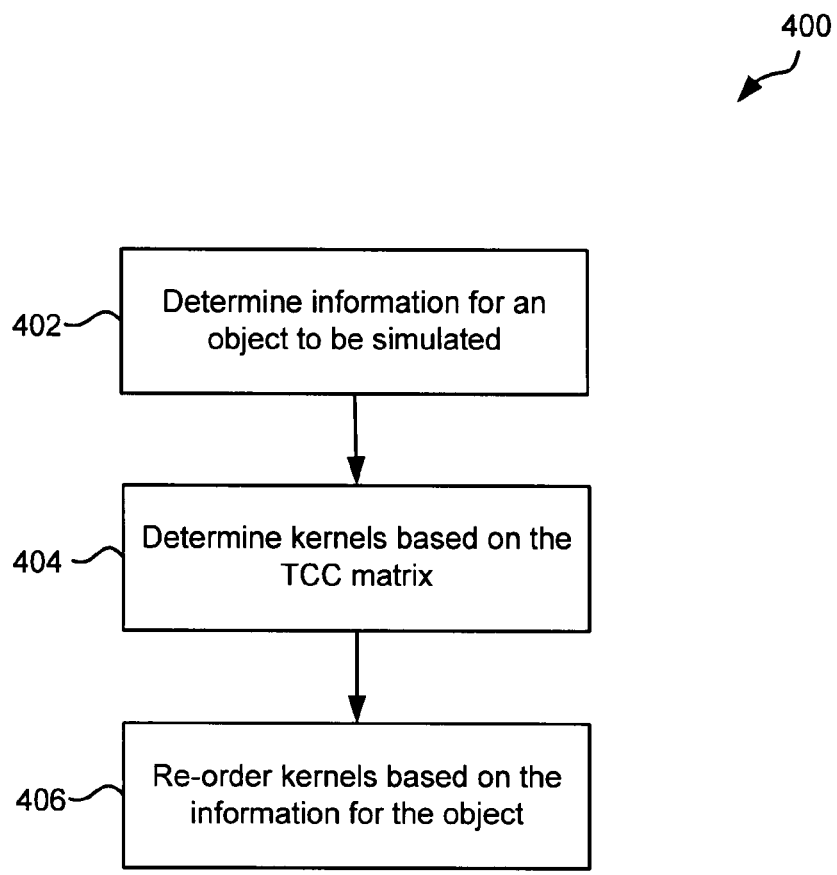
FIG. 4 depicts a simplified flowchart of a method for reordering kernels in a SOCS approximation.

FIG. 4 depicts a simplified flowchart 400 of a method for re-ordering kernels in a SOCS approximation. Step 402 determines information for an object to be simulated. For example, the information may include information about the geometries of the object.

Step 404 determines kernels based on the TCC matrix. Although a TCC is described, it will be understood that other functions may be used. For example, any functions that can be expressed as a sum of coherent systems may be used. The TCC matrix may be determined based on the illumination source and optical system used. A person skilled in the art will appreciate how to calculate the TCC matrix based on parameters of the optical system. Briefly, the kernels of the SOCS series may be determined using an Eigenvalue decomposition to determine a finite set of SOCS kernels. The finite set of kernels is determined based on parameters that do not have to do with the object being simulated. For example, the parameters based on the illumination source and optical system are used to determine the SOCS kernels. The SOCS kernels are weighted based on the Eigenvalues assigned to the kernel. For example, one Eigenfunction corresponds to each distinct Eigenvalue. The weights may be considered an importance value and the kernels are ordered in order of importance based on the weights. Conventionally, an N number of kernels were selected and used to determine the image intensity for the Hopkins imaging integral. However, particular embodiments re-order the kernel importance based on the effect of the object to be simulated. Thus, step 406 re-orders kernels based on the information for the object. For example, if kernels are considered more important than kernels with higher weights in the SOCS series, they would be assigned weights that are higher in the series. The determination indicates kernels that may be better for the different geometries that are provided in a layout. For example, the first object may be better simulated using a first set of kernels and a second object may be better simulated using a second set of kernels.

Figure 5:
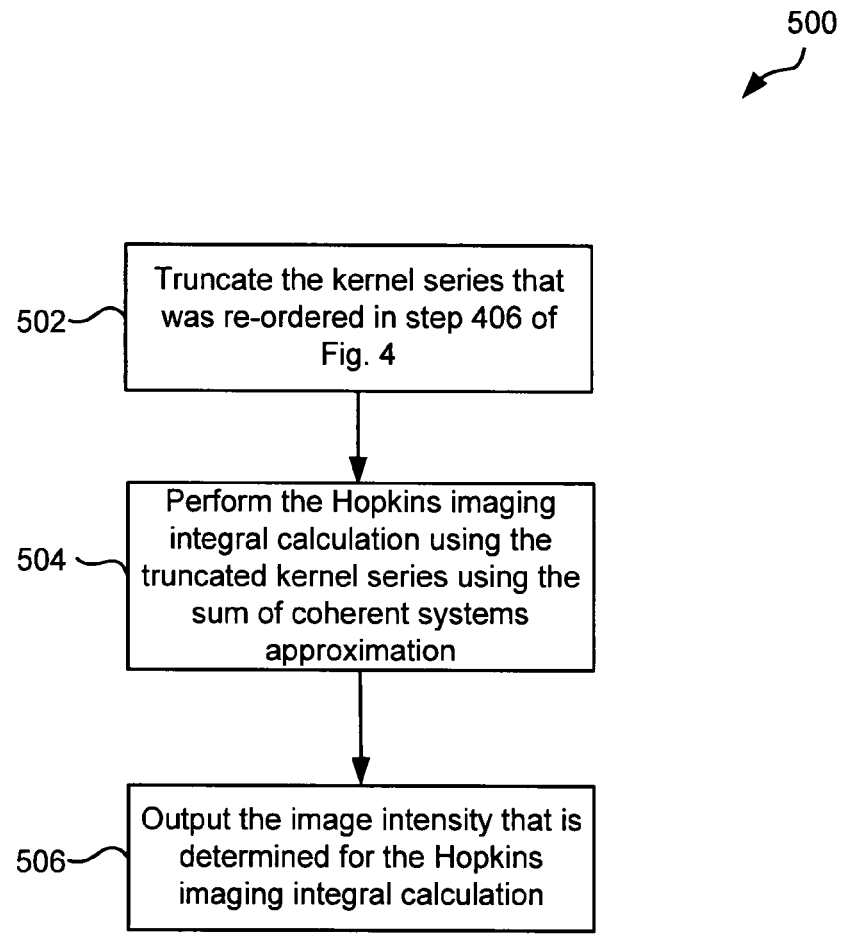
FIG. 5 depicts a simplified flowchart of a method for determining the image intensity.

The SOCS series may then be used to determine the image intensity for the Hopkins imaging integral. FIG. 5 depicts a simplified flowchart 500 of a method for determining the image intensity. Step 502 truncates the kernel series that was re-ordered in step 406 of FIG. 4. For example, an N number of kernels may be selected.

Step 504 performs the Hopkins imaging integral calculation using the truncated kernel series using the sum of coherent systems approximation. For example, the convolution over the entire source map 300 may be performed. A person skilled in the art will appreciate how to calculate the image intensity using the SOCS approximation.

Step 506 then outputs the image intensity that is determined for the SOCS approximation. For example, the image intensity may be used in a model 106 to simulate the optical effects of a manufacturing process on the object in the layout. Then, layout data may be changed to compensate for predicted distortions.

Figure 6:
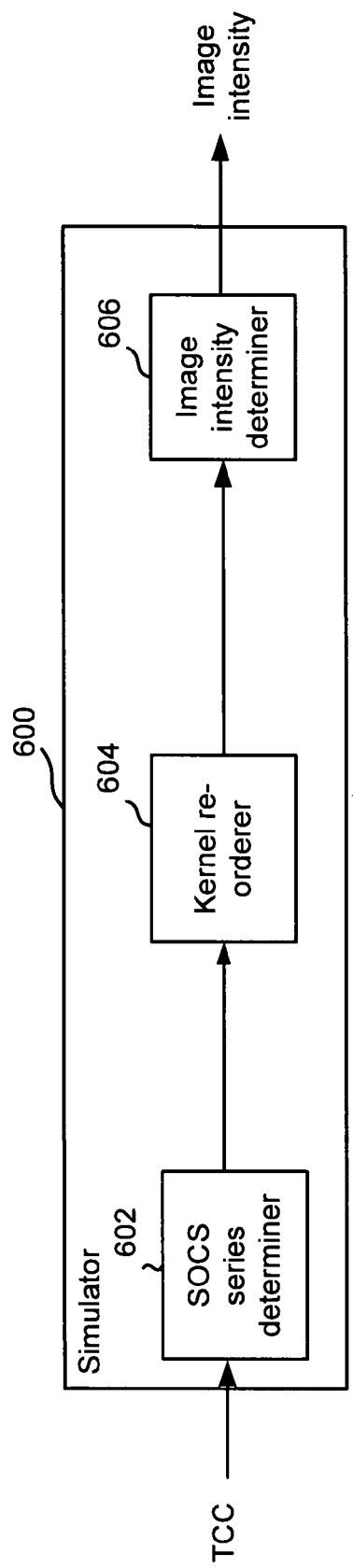
FIG. 6 depicts a more detailed example of a simulator according to one embodiment.

FIG. 6 depicts a more detailed example of a simulator 600 according to one embodiment. As shown, simulator 600 includes a SOCS series determiner 602, a kernel re-orderer 604, and an image intensity determiner 606.

SOCS series determiner 602 is configured to receive a TCC function and determine a SOCS series. For example, the TCC function may be used to determine the SOCS series. Depending on the number of TCC functions used, many SOCS series may be determined. For example, if source map 300 is partitioned in multiple sectors and the Hopkins approach is applied in each sector, then each sector would have a different TCC function.

Kernel re-orderer 604 is then configured to re-order the kernels in the SOCS series. For example, object information may be used to determine which kernels should be considered most important. The kernels are then re-ordered to correspond to different weights.

Image intensity determiner 606 determines the image intensity using the re-ordered SOCS series. For example, the series is truncated at a certain point. Then the kernels are used to determine the image intensity. The point for truncation may be different for various calculations. For example, the number N may be pre-set by a user. Also, the point to truncate the series may depend on how important kernel re-orderer 604 determines each kernel is. If only six kernels are considered relevant and can provide the desired accuracy, then the SOCS series is truncated at six kernels. However, other calculations may need a different number of kernels. Thus, point of truncation may depend on the object to be simulated.

In one example, a model that includes the SOCS kernels 1 through 6 and a tenth kernel for a total of seven kernels may be superior to a model that contains the SOCS kernels from 1 through 8 (for a total of 8 kernels). Thus, the traditional truncation of the first eight kernels does not yield a more accurate model than a model including fewer kernels but ones that have been re-ordered (i.e., the 10th kernel is included in a truncated set of 7 kernels). Using fewer kernels also may decrease the simulation time. For example, the Hopkins imaging integral may be solved faster using fewer kernels. However, accuracy is not compromised and may be better than SOCS approximations that use a greater number of less relevant SOCS kernels.

Figure 7:
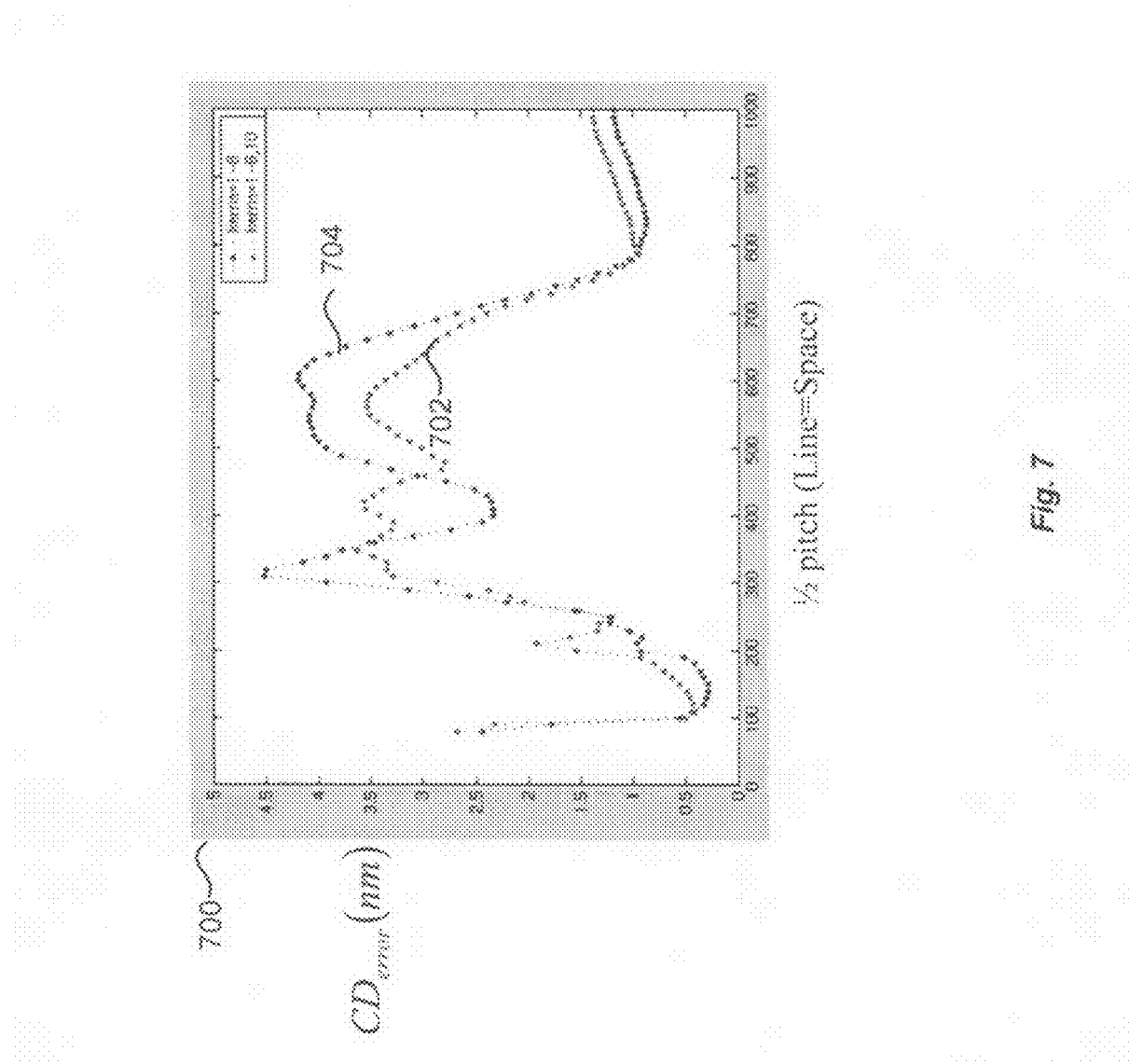
FIG. 7 shows an example of a graph showing an accuracy using particular embodiments as compared to conventional approaches according to one embodiment.

FIG. 7 shows an example of a graph 700 showing an accuracy using particular embodiments as compared to conventional approaches according to one embodiment. The above kernel selection is simulated in graph 700. As shown, a seven kernel model using appropriately selected kernels may be more accurate than an eight kernel model. The error $CD_{error}$ may be determined from a reference model, such as a model derived using the same optical system and a full or larger set of SOCS kernels. The results for different line sizes in a manufacturing process are used to show the difference in accuracy. As shown, an accuracy result 702 for the seven kernel model shows less error for an accuracy result 704 for the eight kernel model.

Although the description has been described with respect to particular embodiments thereof, these particular embodiments are merely illustrative, and not restrictive. Although particular embodiments are described with respect to the creation of integrated circuits, it will be appreciated that the techniques of particular embodiments may be applied to any manufacturing process that is subject to process variations. Examples of processes include, but are not limited to, mask bias, overlay errors, film stack thickness variations, mask phase errors, post-exposure bake temperatures, resist development times and post exposure bake times. Other devices fabricated lithographically where particular embodiments may be applied may include Micro-electromechanical systems (MEMS), magnetic heads for disk drives, photonic devices, diffractive optical elements, nanochannels for transporting biological molecules, etc.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as standalone routines occupying all, or a substantial part, of the system processing. Functions can be performed in hardware, software, or a combination of both. Unless otherwise stated, functions may also be performed manually, in whole or in part.

In the description herein, numerous specific details are provided, such as examples of components and/or methods, to provide a thorough understanding of particular embodiments. One skilled in the relevant art will recognize, however, that a particular embodiment can be practiced without one or more of the specific details, or with other apparatus, systems, assemblies, methods, components, materials, parts, and/or the like. In other instances, well-known structures, materials, or operations are not specifically shown or described in detail to avoid obscuring aspects of particular embodiments.

A "computer-readable medium" for purposes of particular embodiments may be any medium that can contain, store, communicate, propagate, or transport the program for use by or in connection with the instruction execution system, apparatus, system, or device. The computer readable medium can be, by way of example only but not by limitation, an electronic, magnetic, optical, electromagnetic, infrared, or semiconductor system, apparatus, system, device, propagation medium, or computer memory.

Particular embodiments can be implemented in the form of control logic in software or hardware or a combination of both. The control logic, when executed by one or more processors, may be operable to perform that what is described in particular embodiments.

A "processor" or "process" includes any human, hardware and/or software system, mechanism or component that processes data, signals, or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

Reference throughout this specification to "one embodiment", "an embodiment", "a specific embodiment", or "particular embodiment" means that a particular feature, structure, or characteristic described in connection with the particular embodiment is included in at least one embodiment and not necessarily in all particular embodiments. Thus, respective appearances of the phrases "in a particular embodiment", "in an embodiment", or "in a specific embodiment" in various places throughout this specification are not necessarily referring to the same embodiment. Furthermore, the particular features, structures, or characteristics of any specific embodiment may be combined in any suitable manner with one or more other particular embodiments. It is to be understood that other variations and modifications of the particular embodiments described and illustrated herein are possible in light of the teachings herein and are to be considered as part of the spirit and scope.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated particular embodiments, including what is described in the Abstract, is not intended to be exhaustive or to limit the invention to the precise forms disclosed herein. While specific particular embodiments of, and examples for, the invention are described herein for illustrative purposes only, various equivalent modifications are possible within the spirit and scope, as those skilled in the relevant art will recognize and appreciate. As indicated, these modifications may be made to the present invention in light of the foregoing description of illustrated particular embodiments and are to be included within the spirit and scope.

Thus, while the present invention has been described herein with reference to particular embodiments thereof, a latitude of modification, various changes and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit. It is intended that the invention not be limited to the particular terms used in following claims and/or to the particular embodiment disclosed as the best mode contemplated for carrying out this invention, but that the invention will include any and all particular embodiments and equivalents falling within the scope of the appended claims.

I claim:

1. A method comprising:
   using a processor, determining information for an object to be simulated for a manufacturing process;
   determining a set of kernels that represent a transmission cross coefficient matrix;
   associating each kernel with an importance value;
   ordering the kernels into a first order according to their respective importance values;
   determining a relevance value for each kernel, wherein the relevance value is based on a combination of the respective importance value and the information for the object;
   re-ordering the kernels into a second order according to their respective relevance values, wherein the first order is different from the second order; and
   truncating the reordered kernels.

2. The method of claim 1, wherein the re-ordering comprises assigning a different importance value for one or more kernels such that a ranking of the kernels according to their respective importance values reflects a ranking of the kernels according to their respective relevance values.

3. The method of claim 1, further comprising calculating an image intensity using the truncated kernels.

4. The method of claim 1, wherein the importance values comprise weights that are assigned to kernels by an order of importance.

5. The method of claim 1, further comprising:
   determining a first kernel that models the object more accurately than a second kernel; and
   assigning the first kernel a higher importance value than the second kernel.

6. The method of claim 1, wherein the information for the object comprises geometric pattern information.

7. The method of claim 1, wherein the information for the object comprises a layout for an integrated circuit design.

8. The method of claim 1, wherein the information for the object comprises a photomask used for manufacturing integrated circuits.

9. The method of claim 1, further comprising producing a lithographic mask using the truncated kernels.

10. The method of claim 1, further comprising creating an integrated circuit using a lithographic mask produced using the truncated kernels.

11. The method of claim 1, further comprising storing a circuit layout pattern in a computer-readable storage medium, the circuit layout pattern generated at least in part using the truncated kernels.

12. A computer-readable storage medium storing one or more instructions for execution by one or more processors that when executed by the one or more processors cause the processors to perform a method, the method comprising:
   determining information for an object to be simulated for a manufacturing process;
   determining a set of kernels that represent a transmission cross coefficient matrix;
   associating each kernel with an importance value;
   ordering the kernels into a first order according to their respective importance values;
   determining a relevance value for each kernel, wherein the relevance value is based on a combination of the respective importance value and the information for the object;
   re-ordering the kernels into a second order according to their respective relevance values, wherein the first order is different from the second order; and
   truncating the reordered kernels.

13. The computer-readable storage medium of claim 12, wherein the re-ordering comprises assigning a different importance value for one or more kernels such that a ranking of the kernels according to their respective importance values reflects a ranking of the kernels according to their respective relevance values.

14. The computer-readable storage medium of claim 12, wherein the method further comprises calculating an image intensity using the truncated kernels.

15. The computer-readable storage medium of claim 12, wherein the importance values comprise weights that are assigned to kernels by an order of importance.

16. The computer-readable storage medium of claim 12, wherein the method further comprises:
   determining a first kernel that models the object more accurately than a second kernel; and
   assigning the first kernel a higher importance value than the second kernel.

17. The computer-readable storage medium of claim 12, wherein the information for the object comprises geometric pattern information.

18. The computer-readable storage medium of claim 12, wherein the information for the object comprises a layout for an integrated circuit design.

19. The computer-readable storage medium of claim 12, wherein the information for the object comprises a photomask used for manufacturing integrated circuits.

20. A system comprising:
   an object information determiner that determines information for an object to be simulated for a manufacturing process;
   a series determiner that determines a set of kernels that represent a transmission cross coefficient matrix, associates each kernel with an importance value, and orders the kernels into a first order according to their respective importance values;
   a kernel analyzer that determines a relevance value for each kernel, wherein the relevance value is based on a combination of the respective importance value and the information for the object;
   a kernel reorderer that re-orders the kernels into a second order according to their respective relevance values and truncates the reordered kernels, wherein the first order is not the same order as the second order; and
   a model determiner that generates a model for an image intensity to be used in simulating optical effects of the object in the manufacturing process, wherein the model is based at least in part on the truncated kernels.

21. The system of claim 20, further comprising a simulator that simulates the optical effects using the model.

22. The system of claim 20, further comprising a simulator that receives a layout file having a layout of an integrated circuit and that uses the layout to model the optical effects for the object.

23. The system of claim 20, wherein the kernel reorderer further assigns a different importance value for one or more kernels such that a ranking of the kernels according to their respective importance values reflects a ranking of the kernels according to their respective relevance values.

* * * * *